US012414430B2

(12) United States Patent
Yamamoto et al.

(10) Patent No.: US 12,414,430 B2
(45) Date of Patent: Sep. 9, 2025

(54) PHOTOELECTRIC CONVERSION ELEMENT, DISPLAY DEVICE, AND METHOD OF MANUFACTURING PHOTOELECTRIC CONVERSION ELEMENT

(71) Applicant: SHARP KABUSHIKI KAISHA, Sakai (JP)

(72) Inventors: Satoru Yamamoto, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 394 days.

(21) Appl. No.: 18/028,196

(22) PCT Filed: Sep. 28, 2020

(86) PCT No.: PCT/JP2020/036639
§ 371 (c)(1),
(2) Date: Mar. 23, 2023

(87) PCT Pub. No.: WO2022/064697
PCT Pub. Date: Mar. 31, 2022

(65) Prior Publication Data
US 2023/0380206 A1 Nov. 23, 2023

(51) Int. Cl.
*H10K 50/16* (2023.01)
*H10K 85/00* (2023.01)
*H10K 101/00* (2023.01)

(52) U.S. Cl.
CPC ............. *H10K 50/16* (2023.02); *H10K 85/00* (2023.02); *H10K 2101/80* (2023.02)

(58) Field of Classification Search
CPC .................. H10K 50/14–167; H10K 2101/80
See application file for complete search history.

(56) References Cited

U.S. PATENT DOCUMENTS

2010/0108984 A1   5/2010  Cho et al.
2022/0285644 A1*  9/2022  Honda ................... H10K 71/80

FOREIGN PATENT DOCUMENTS

JP          2010114079 A       5/2010

* cited by examiner

*Primary Examiner* — Daniel P Shook
(74) *Attorney, Agent, or Firm* — ScienBiziP, P.C.

(57) ABSTRACT

A photoelectric conversion element includes: a first electrode and a second electrode; a photoelectric conversion layer between the first electrode and the second electrode; and a carrier transport layer between the photoelectric conversion layer and the second electrode, the carrier transport layer containing a plurality of carrier transport particles and a plurality of organic ligands, the carrier transport layer having a first end potion located close to the photoelectric conversion layer in a thickness direction of the carrier transport layer and a second end potion located close to the second electrode in the thickness direction of the carrier transport layer, wherein a first minimum distance between the plurality of carrier transport particles in the first end potion and the photoelectric conversion layer is larger than a second minimum distance between the plurality of carrier transport materials particles in the second end potion and the second electrode.

20 Claims, 10 Drawing Sheets

PHOTOELECTRIC CONVERSION ELEMENT, DISPLAY DEVICE, AND METHOD OF MANUFACTURING PHOTOELECTRIC CONVERSION ELEMENT

TECHNICAL FIELD

The disclosure relates to photoelectric conversion elements, display devices, and methods of manufacturing a photoelectric conversion element.

BACKGROUND ART

Various flat panel display devices have been developed. Especially, those display devices which include QLEDs (quantum-dot light-emitting diodes) or OLEDs (organic light-emitting diodes) as electroluminescent elements are attracting attention.

Patent Literature 1 discloses a structure including a light-emitting quantum-dot layer with a surface in contact with a hole transport layer and a surface in contact with an electron transport layer, the surfaces having different organic ligand distributions.

CITATION LIST

Patent Literature

Patent Literature 1
Japanese Unexamined Patent Application Publication, Tokukai, No. 2010-114079 (Publication Date: May 20, 2010)

SUMMARY

Technical Problem

Photoelectric conversion elements such as light-emitting elements and light-receiving elements are known that include charge transport layers, such as an electron transport layer and a hole transport layer, that contain nanoparticles of a charge transport material and organic ligands coordinated to the nanoparticles.

In such a charge transport layer, organic ligands intervene between the nanoparticles of a charge transport material and an electrode such as an anode or a cathode. Since the organic ligands are dielectric, defects could occur in electrical contacts between the nanoparticles and the electrode, which in turn would form an electrostatic capacity.

Consequently, the electric charges injected to the light-emitting element while the light-emitting element is turned on (or the electric charges generated while the light-receiving element is exposed to light) are undesirably retained for an extended period of time in the element even after the light-emitting element is turned off (or even after the light-receiving element is shielded from light).

Solution to Problem

To address these problems, the disclosure, in one aspect thereof, is directed to a photoelectric conversion element including: a first electrode and a second electrode facing each other; a photoelectric conversion layer between the first electrode and the second electrode; and a carrier transport layer between the photoelectric conversion layer and the second electrode, the carrier transport layer containing a plurality of carrier transport particles and a plurality of organic ligands capable of being coordinated to each of the plurality of carrier transport particles, the carrier transport layer having a first end potion located close to the photoelectric conversion layer in a thickness direction of the carrier transport layer and a second end potion located close to the second electrode in the thickness direction of the carrier transport layer, wherein a first minimum distance between the plurality of carrier transport particles in the first end potion and the photoelectric conversion layer is larger than a second minimum distance between the plurality of carrier transport particles in the second end potion and the second electrode.

To address the problems, the disclosure, in one aspect thereof, is directed to a photoelectric conversion element including: a first electrode and a second electrode facing each other; a photoelectric conversion layer between the first electrode and the second electrode; and a carrier transport layer between the photoelectric conversion layer and the second electrode, the carrier transport layer containing a plurality of carrier transport particles and a plurality of organic ligands capable of being coordinated to each of the plurality of carrier transport materials particles, the carrier transport layer having a first end potion located close to the photoelectric conversion layer in a thickness direction of the carrier transport layer and a second end potion located close to the second electrode in the thickness direction of the carrier transport layer, wherein a first ratio of the plurality of organic ligands in the first end potion to the plurality of carrier transport particles in the first end potion is larger than a second ratio of the plurality of organic ligands in the second end potion to the plurality of carrier transport particles in the second end potion.

To address the problems, the disclosure, in one aspect thereof, is directed to a method of manufacturing a photoelectric conversion element, the method including: a first step of forming a first electrode; a second step of forming a photoelectric conversion layer overlying the first electrode; a third step of forming a carrier transport layer overlying the photoelectric conversion layer so that the carrier transport layer contains a plurality of carrier transport particles and a plurality of organic ligands capable of being coordinated to each of the plurality of carrier transport particles; and a fourth step of forming a second electrode overlying the carrier transport layer, wherein the method further includes a fifth step of removing parts of the plurality of organic ligands from the carrier transport layer.

Advantageous Effects of Disclosure

The disclosure, in one aspect thereof, provides good electrical contacts between the plurality of carrier transport particles in the carrier transport layer and the second electrode and for this reason, reduces the retention time of electric charges in the electroluminescent element.

DESCRIPTION OF EMBODIMENTS

Embodiment 1

Method of Manufacturing Display Device and Structure of Display Device

Throughout the following description, expressions like "component A is in the same layer as component B" indicate that components A and B are formed in a single process or step (film forming step), expressions like "component A underlies/is below component B" indicate that component A is formed in an earlier process or step than component B, and expressions like "component A overlies/is on or above component B" indicate that component A is formed in a later process or step than component B.

Figure 1:
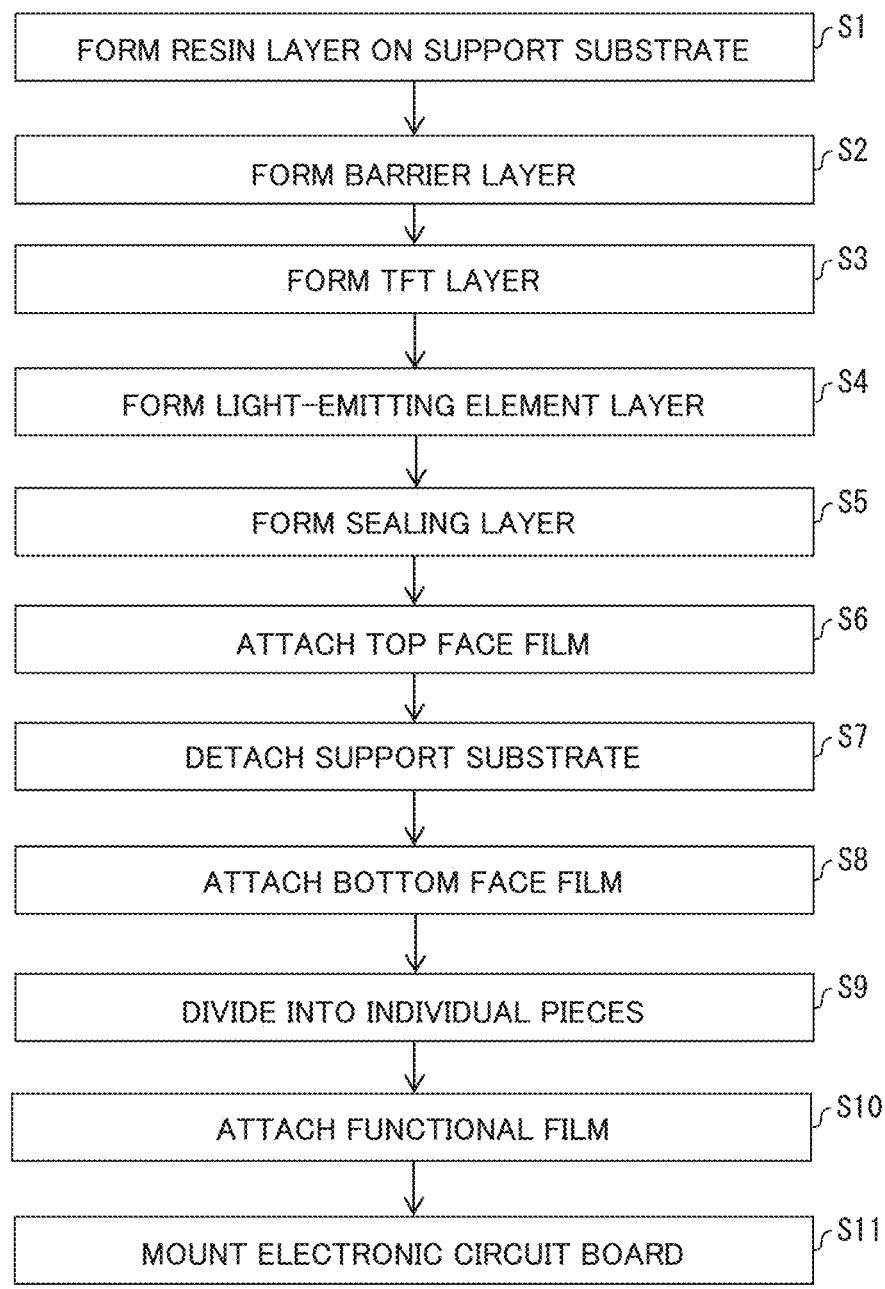
FIG. 1 is a flow chart representing an exemplary method of manufacturing a display device in accordance with an embodiment of the disclosure.
Figure 2:
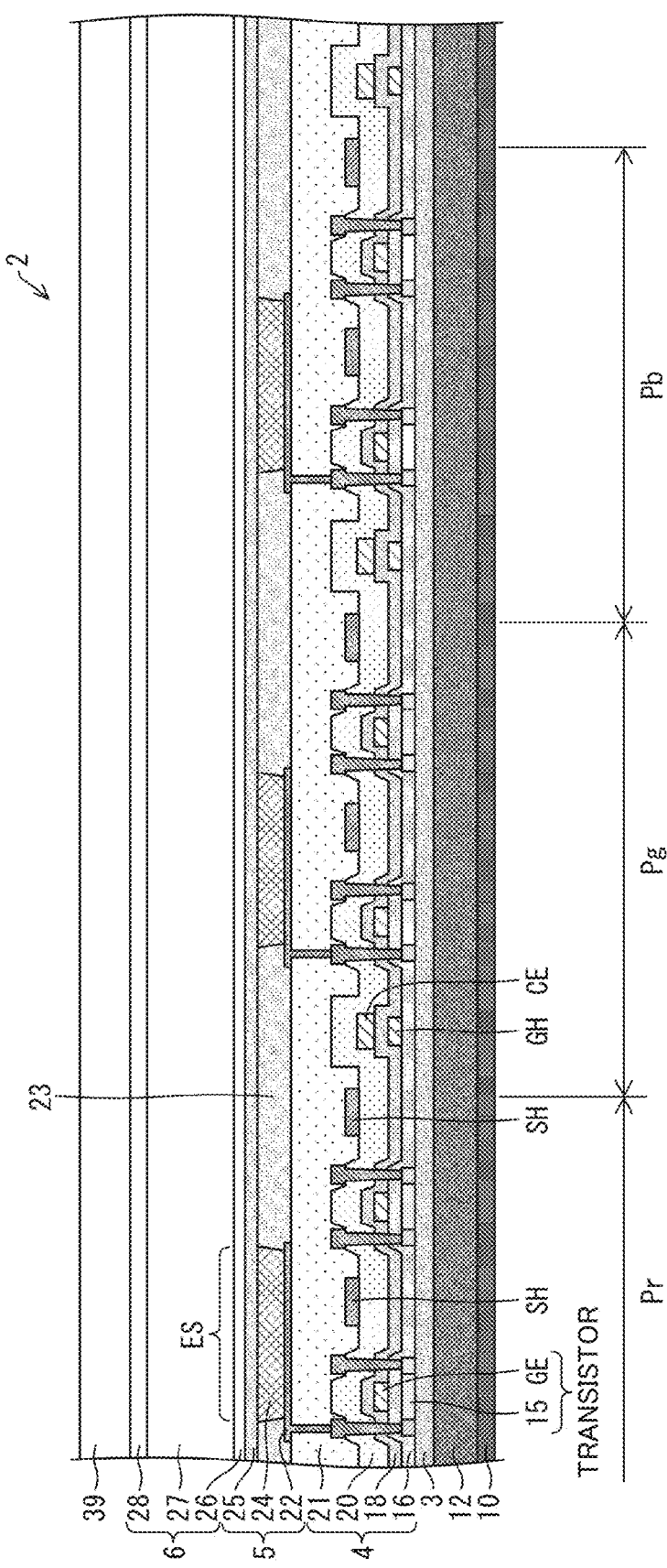
FIG. 2 is a schematic cross-sectional view of an exemplary structure of a display area of the display device in accordance with the embodiment of the disclosure.

FIG. 1 is a flow chart representing an exemplary method of manufacturing a display device. FIG. 2 is a schematic cross-sectional view of an exemplary structure of a display area of a display device 2.

To manufacture a flexible display device, first, a resin layer 12 is formed on a transparent support substrate (e.g., mother glass) as shown in FIGS. 1 and 2 (step S1). Next, a barrier layer 3 is formed (step S2). A thin film transistor layer 4 (TFT layer) is then formed (step S3). Next, a top-emission light-emitting element layer 5 is formed (step S4). Subsequently, a sealing layer 6 is formed (step S5). A top face film is then attached to the sealing layer 6 (step S6).

Next, the support substrate is detached from the resin layer 12 by laser irradiation (step S7). Next, a bottom face film 10 is attached to the bottom face of the resin layer 12 (step S8). Next, a stack body of the bottom face film 10, the resin layer 12, the barrier layer 3, the thin film transistor layer 4, the light-emitting element layer 5, and the sealing layer 6 is divided to obtain a plurality of individual pieces (step S9). Next, a functional film 39 is attached to the resultant individual pieces (step S10). Next, an electronic circuit board (e.g., an IC chip and an FPC) is mounted to a portion (terminal section) outside a display area where there is provided a plurality of subpixels (a non-display area or a frame area) (step S11). Steps S1 to S11 are carried out by a manufacturing machine for the display device 2 (including a film-forming machine for steps S1 to S5).

The resin layer 12 is made of, for example, a polyimide. The resin layer 12 may be replaced by a combination of two resin films (e.g., polyimide films) and an inorganic insulating film interposed between these two resin films.

The barrier layer 3 prevents foreign materials such as water and oxygen from reaching the thin film transistor layer 4 and the light-emitting element layer 5. The barrier layer 3 may include, for example, a silicon oxide film, a silicon nitride film, a silicon oxynitride film, or a stack of these films. These films can be formed by CVD.

The thin film transistor layer 4 includes: a semiconductor film 15; an inorganic insulating film 16 (gate insulating film) overlying the semiconductor film 15; gate electrodes GE and gate lines GH overlying the inorganic insulating film 16; an inorganic insulating film 18 (interlayer insulating film) overlying the gate electrodes GE and the gate lines GH; capacitor electrodes CE overlying the inorganic insulating film 18; an inorganic insulating film 20 (interlayer insulating film) overlying the capacitor electrodes CE; source lines SH overlying the inorganic insulating film 20; and a planarization film 21 (interlayer insulating film) overlying the source lines SH.

The semiconductor film 15 is made of, for example, a low-temperature polysilicon (LTPS) or an oxide semiconductor (e.g., In—Ga—Zn—O-based semiconductor). FIG. 2 shows the transistors having a top-gate structure. Alternatively, the transistors may have a bottom-gate structure.

The gate electrodes GE, the gate lines GH, and the capacitor electrodes CE, and the source lines SH are made of, for example, a monolayer or multilayer film of at least one of metals of aluminum, tungsten, molybdenum, tantalum, chromium, titanium, and copper.

The inorganic insulating films 16, 18, and 20 may be made of, for example, a silicon oxide (SiOx) film, a silicon nitride (SiNx) film, or a silicon oxynitride (SiNO) film formed by CVD or a stack of layered these films. The planarization film 21 may be made of, for example, an organic material, such as a polyimide or an acrylic, that can be provided by printing or coating technology.

The light-emitting element layer 5 includes: anodes 22 ("pixel electrodes") overlying the planarization film 21; insulating edge covers 23 covering edges of the anodes 22; an active layer 24, which is an EL (electroluminescence) layer, overlying the edge covers 23; and a cathode ("common electrode") overlying the active layer 24. The edge covers 23 are formed, for example, by patterning an applied organic material such as a polyimide or an acrylic by photolithography.

In each subpixel, a light-emitting element ES (electroluminescent element), which is a QLED, including one of the insular anodes 22, the active layer 24, and the cathode 25 is formed in the light-emitting element layer 5, and a subpixel circuit for controlling the light-emitting element ES is formed in the thin film transistor layer 4.

The active layer 24 includes, for example, an electron injection layer, an electron transport layer, a light-emitting layer, a hole transport layer, and a hole injection layer, all of which are provided in this order when viewed from below. The active layer 24 may not include one or more of the electron injection layer, the electron transport layer, the hole transport layer, and the hole injection layer.

Each anode 22 is a reflective electrode that reflects light. The reflective electrode is made of, for example, a stack of ITO (indium tin oxide) and either Ag (silver) or a Ag-containing alloy or made of a Au-, Ag-, Cu-, or Al-containing material. The cathode 25 is a transparent electrode made of a transparent conductive material. This transparent conductive material is, for example, a Ag, Au, Pt, Ni, or Ir thin film, a Mg—Ag alloy thin film, ITO, IZO (indium zinc oxide), AZO (aluminum doped zinc oxide), or GZO (galium doped zinc oxide). When the display device is not a top-emission type, but a bottom-emission type, the bottom face film 10 and the resin layer 12 are transparent, the anodes 22 are transparent electrodes, and the cathode 25 is a reflective electrode.

Alternatively, the cathode 25 may be provided as insular "pixel electrodes" overlying the planarization film 21, and the anodes 22 may be provided as a "common electrode" overlying the active layer 24. When this is the case, the active layer 24 includes, for example, a hole injection layer, a hole transport layer, a light-emitting layer, an electron transport layer, and an electron injection layer, all of which are provided in this order when viewed from below. The active layer 24 may not include one or more of the hole injection layer, the hole transport layer, the electron transport layer, and the electron injection layer. When the display device is a top-emission type, the anodes 22 are transparent electrodes, and the cathode 25 is a reflective electrode, On the other hand, when the display device is a bottom-emission type, the cathode 25 is a transparent electrode, and the anodes 22 are reflective electrodes.

In the light-emitting element ES, holes and electrons recombine in the light-emitting layer due to a drive current flowing between the anode 22 and the cathode 25, to produce excitons that transition from the lowest unoccupied molecular orbital (LUMO) or conduction band (conduction band) to the highest occupied molecular orbital (HOMO) or valence band (valence band) of the quantum dot to emit light.

The sealing layer 6 is transparent and includes: an inorganic sealing film 26 covering the cathode 25; an organic buffer film 27 overlying the inorganic sealing film 26; and an inorganic sealing film 28 overlying the organic buffer film 27. The sealing layer 6, covering the light-emitting element layer 5, prevents foreign materials such as water and oxygen from reaching the light-emitting element layer 5.

The inorganic sealing film 26 and the inorganic sealing film 28 are inorganic insulating films and may each include, for example, a silicon oxide film, a silicon nitride film, a silicon oxynitride film, or a stack of these films. These films can be formed by CVD. The organic buffer film 27 is a transparent organic film that exhibits a planarization effect. The organic buffer film 27 may be made of an organic material, such as an acrylic, that can be provided by printing or coating technology. The organic buffer film 27 may be formed, for example, by inkjet printing. There may be provide a bank in the non-display area to stop liquid droplets.

The bottom face film 10 is, for example, a PET film attached to the bottom face of the resin layer 12 after the support substrate is detached, thereby providing for a highly flexible display device. The functional film 39 has, for example, at least one of an optical compensation function, a touch sensor function, and a protection function.

The description has so far focused on the flexible display device. To manufacture a non-flexible display device, since there is generally no need to, for example, form a resin layer and replace the base material, for example, layer-forming steps S2 to S5 are carried out on the glass substrate before the process proceeds to step S9. Meanwhile, to manufacture a non-flexible display device, a transparent sealing member may be attached in a nitrogen atmosphere using an adhesive sealant, instead of, or in addition to, the formation of the sealing layer 6. The transparent sealing member may be made of glass or plastic and is preferably concave.

Present Embodiment 1 relates particularly to the hole transport layer or the electron transport layer in the active layer 24 in the above-described structure of the display device. Present Embodiment 1 relates particularly to the step of forming the light-emitting element layer 5 (step S4) in the above-described method of manufacturing of a display device.

Structure of Light-Emitting Element

Figure 3:
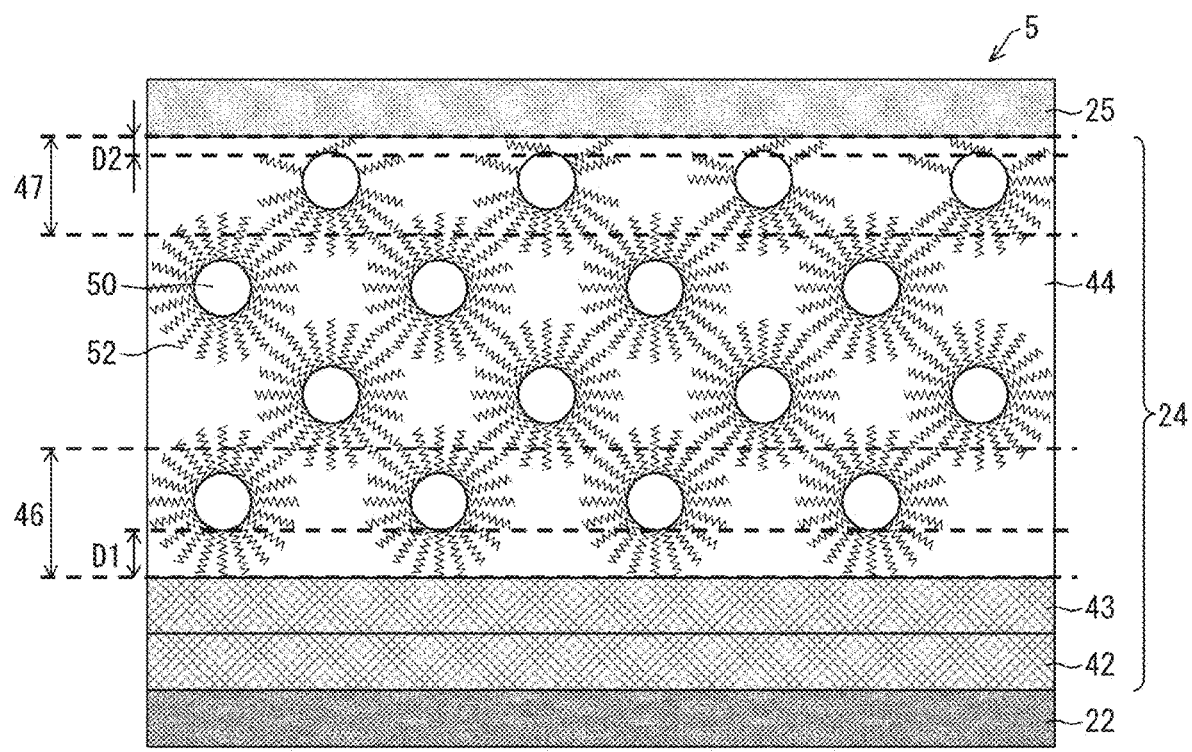
FIG. 3 is a schematic cross-sectional view of a structure of a light-emitting element layer in accordance with the embodiment of the disclosure.

FIG. 3 is a schematic cross-sectional view of a structure of the light-emitting element layer 5 in the light-emitting element ES (photoelectric conversion element) of present Embodiment 1.

Referring to FIG. 3, the light-emitting element layer 5 includes: the anode 22 (first electrode) and the cathode 25 (second electrode) facing each other; a light-emitting layer 43 (photoelectric conversion layer) between the anode 22 and the cathode 25; a hole transport layer 42 between the light-emitting layer 43 and the anode 22; and an electron transport layer 44 (carrier transport layer) between the light-emitting layer 43 and the cathode 25.

The present specification describes, as examples, the light-emitting element ES including the light-emitting layer 43 as a photoelectric conversion layer, a display device including a plurality of light-emitting elements ES, and a method of manufacturing the light-emitting element ES. The scope of the disclosure is not limited to these examples. For instance, the scope of the disclosure encompasses a light-receiving element including a light-receiving layer as a photoelectric conversion layer, a sensor device including a plurality of light-receiving elements, and a method of manufacturing a light-receiving element.

Hole Transport Layer

The hole transport layer 42 may have any structure and may contain one or more hole-transporting organic materials. Examples of the hole-transporting organic material include PEDOT: PSS (polyethylenedioxythiophene/polystyrene sulfonate), PVK (poly-N-vinyl carbazole), TFB (poly [(9,9-dioctylfluorenyl-2,7-diyl)-co-(4,4'-(N-(4-sec-butylphenyl) diphenylamine))]), and poly-TPD (N,N'-bis (4-butylphenyl)-N,N'-bis (phenyl)-benzidine).

Good electrical contacts are preferably formed between the hole transport layer 42 and the anode 22. Alternatively, there may be provided an additional hole injection layer between the hole transport layer 42 and the anode 22.

Light-Emitting Layer

The light-emitting layer 43 may contain an organic light-emitting material and preferably contains quantum dots. These quantum dots include inorganic nanocrystals and ligands. Therefore, the organic ligands 52 can be partially removed more readily in a removing step detailed later (see step S26 in FIG. 5) without damaging the capability of the light-emitting layer 43 when the light-emitting layer 43 contains quantum dots than when the light-emitting layer 43 contains an organic light-emitting material.

The quantum-dot nanocrystals may have any structure including a core structure, a core-shell structure, or a core-multishell structure. The quantum-dot nanocrystals may contain, for example, at least one of the species selected from CdSe, ZnSe, CdZnSe, and InP.

Electron Transport Layer

The electron transport layer 44 contains a plurality of particles 50 (carrier transport particles) and the plurality of organic ligands 52. The particles 50 are made of an electron transporting material and nano-sized in diameter (in other words, from 1 nm inclusive to 1,000 nm exclusive).

The electron transport layer 44 preferably has a suitable thickness and specifically has a thickness greater than or equal to a 2-particle layer in which two or more particles 50 are stacked and smaller than or equal to a 30-particle layer in which 30 or more particles 50 are stacked, for the following reasons. If the electron transport layer 44 is too thin, holes may form through the electron transport layer 44, so that the light-emitting layer 43 could be short-circuited to the cathode 25. On the other hand, if the electron transport layer 44 is too thick, the electron transport layer 44 exhibits an increased electric resistance, so that the luminous efficiency of the light-emitting element ES could suffer.

The particles 50 preferably either contain one or more mixtures selected from the group consisting of an electron-transporting elemental semiconductor, compound semiconductor, oxide semiconductor, metal oxide, chalcogenide, and perovskite or contain two or more mixed crystals selected from the group. Hence, the particles 50 are composed of an inorganic material, and the organic ligands 52 are composed of an organic material. Therefore, the organic ligands 52 can be partially removed readily in a removing step detailed later (see step S26 in FIG. 5) without damaging the particles 50.

The particles 50 more preferably either contain one or more metal oxides selected from the group consisting of ZnO, MgO, LiO, TiO$_2$, ZrO$_2$, SnO$_2$, and Nb$_2$O$_3$ or contain a mixed crystal containing one or more metal oxides selected from the group because the use of these materials enables manufacturing nanoparticles that have high general applicability. Examples of the mixed crystal include ZnMgO and LiZnO because mixed crystals allow for finer control of the conduction band energy level.

The particles 50 preferably have a particle diameter of from 1 nm to 10 nm, both inclusive. If the particle diameter is smaller than 1 nm, the particle diameter has a large distribution relative to the average particle diameter, and the band gap changes sensitively to variations in the particle diameter. For these reasons, it becomes difficult to manufacture the plurality of particles 50 with a sufficiently small distribution of the band gap. The particles 50 therefore preferably have a particle diameter of greater than or equal to 1 nm. If the particle diameter exceeds 10 nm, the quantum effects are compromised. The quantum effects contribute increases in the electronic mobility of the electron transport layer 44. The particles 50 hence preferably have a particle diameter of less than or equal to 10 nm.

The organic ligands 52 are an organic compound capable of being coordinated to the particles 50. The organic ligands 52 contain, for example, a compound with one or more substituent species selected from the group consisting of an alcohol group, a keto group, a carbonyl group, a phenyl group, an ether group, an ester group, an amino group, and a thiol group. The organic ligands 52 may contain, for example, one or more organic compounds selected from the group consisting of PVP (polyvinyl phenol), octadecene, oleic acid, oleyl amine, triethylamine, ethanol amine, and triethanol amine.

The organic ligands 52 preferably have a molecular length of from 1 nm to 10 nm, both inclusive, for the following reasons. If the molecular length is smaller than 1 nm, it is difficult to prevent deactivation of the particles 50. On the other hand, if the molecular length exceeds 10 nm, the movement of electrons between the particles 50 is appreciably disrupted.

Preferably, the particles 50 either contain one or more metal oxides selected from the group consisting of ZnO, MgO, and LiO or contain a mixed crystal containing one or more metal oxides selected from the group, and the organic ligands 52 contain a compound with one or more substituent species selected from the group consisting of an alcohol group, a keto group, a carbonyl group, a phenyl group, an ether group, an ester group, an amino group, and a thiol group because one of these substituents is needed for bonding with the particles 50. Suitable particle-to-particle distances are maintained between the particles 50 by the organic ligands 52, having any of these substituents, that bond with the particles 50. For instance, the organic ligands 52 contain one or more organic compounds selected from the group consisting of PVP, octadecene, oleic acid, oleyl amine, triethylamine, ethanol amine, and triethanol amine. The particles 50 bond particularly strongly with the organic ligands 52 when the particles 50 are made of any of the materials listed above, and the organic ligands 52 contain any of the organic compounds listed above. The chemical stability of the nanoparticles is hence improved. Additionally, the particle-to-particle distance of the particles 50 is optimized.

End Potion of Electron Transport Layer

The electron transport layer 44 has a first end potion 46 and a second end potion 47. The first end potion 46 is a part of the electron transport layer 44 that is located close to the light-emitting layer 43 in the thickness direction of the electron transport layer 44. The second end potion 47 is a part of the electron transport layer 44 that is located close to the cathode 25 in the thickness direction of the electron transport layer 44. In the electron transport layer 44, the particles 50 in the first end potion 46 are separated from the light-emitting layer 43 by at least a minimum distance D1 (first minimum distance), the particles 50 in the second end potion 47 are separated from the cathode 25 by at least a minimum distance D2 (second minimum distance), and the minimum distance D1 is larger than the minimum distance D2.

Good electrical contacts are therefore formed between the particles 50 in the electron transport layer 44 and the cathode 25 in accordance with present Embodiment 1. Consequently, either no electrostatic capacity is formed between the particles 50 and the cathode 25 or a smaller electrostatic capacity is formed between the particles 50 and the cathode 25 than in a comparative example detailed later (see FIG. 10). This prevents the light-emitting element ES from retaining electric charges, which in turn reduces the time over which the light-emitting element ES, after being turned off, retains the electric charges injected to the light-emitting element ES while the light-emitting element ES is turned on.

The aforementioned difference between the minimum distances is achieved by the organic ligands 52 being distributed differently in the first end potion 46 and the second end potion 47. Specifically, the ratio of the organic ligands 52 in the first end potion 46 to the particles 50 in the first end potion 46 (first ratio) is larger than the ratio of the organic ligands 52 in the second end potion 47 to the particles 50 in the second end potion 47 (second ratio).

In the first end potion 46 (and in an intermediate area, if any, between the first end potion 46 and the second end potion 47), since the organic ligands 52 have a larger ratio, the particles 50 are sufficiently coated by the organic ligands 52. Consequently, the minimum distance D1 between the particles 50 in the first end potion 46 and the light-emitting layer 43 is large. Meanwhile, the particles 50 in the first end potion 46 (and in the intermediate area, if any) is adequately prevented from deactivation.

In contrast, in the second end potion 47, since the ratio of the organic ligands 52 in the second end potion 47 is small, the organic ligands 52 are insufficient in number to coat the particles 50. Therefore, for example, the thickness of the coating of the particles 50 by the organic ligands 52 can be partially or entirely thin, or the particles 50 can be partially or entirely exposed. Consequently, the minimum distance D2 between the particles 50 in the second end potion 47 and the cathode 25 is small.

The ratio of the organic ligands 52 in the second end potion 47 is preferably from 0 to ½ times, both inclusive, the ratio of the organic ligands 52 in the first end potion 46. When the ratio is less than or equal to ½, the particles 50 in the second end potion 47 are likely to be partially or entirely exposed. Electrostatic capacity is hence prevented from forming between the electron transport layer 44 and the cathode 25.

Here, the ratio of the organic ligands 52 to the particles 50 is either a mass ratio or a rate of amount of substance. In both the first end potion 46 and the second end potion 47, the mass ratio of the particles 50 to the organic ligands 52 is from 100:1 to 1:300, and the rate of amount of substance of the particles 50 to the organic ligands 52 is from 3:1 to 1:1,500. These ratios can be measured by the following procedures. First, a sample is collected from the first end potion 46 or the second end potion 47 of the electron transport layer 44. Next, each sample is dissolved in an organic solvent to prepare a solution. Next, each solution is subjected to column chromatography. Next, each solution that comes out of column chromatography is collected. Next, the concentration of the organic ligands 52 in each solution is measured. Then, the ratio of the organic ligands 52 to the particles 50 in the sample of the first end potion 46 or the second end potion 47 is calculated from this concentration. Alternatively, the same amount of samples may be taken, one from the first end potion 46 and the other from the second end potion 47, and dissolved in the same amount of organic solvents. Here, the magnitude order of the resultant ratios matches the magnitude order of the concentrations of the organic ligands 52 in the solutions that come out of column chromatography.

The second end potion 47 is preferably in direct contact with the cathode 25 with no intervening layer. As described above, the ratio of the organic ligands 52 in the second end potion 47 is small. Therefore, in some layers that are in contact with the second end potion 47, the particles 50 are susceptible to being deactivated due to aggregation or Ostwald growth. Therefore, the layers that are in contact with the second end potion 47 are preferably the cathode 25 to prevent deactivation of the particles 50.

Furthermore, the particles 50 in the second end potion 47 are preferably in direct contact with the cathode 25. The particles 50 in the second end potion 47 of the electron transport layer 44 are separated from the cathode 25 by at least a minimum distance of 0 if the particles 50 are in direct contact with the cathode 25. Therefore, electrostatic capacity is prevented from forming between the electron transport layer 44 and the cathode 25.

The second end potion 47 is preferably a single-particle layer in relation to the particles 50. If the second end potion 47 has a thickness greater than or equal to a 2-particle layer, the particles 50 are susceptible to being deactivated inside the second end potion 47 because as described above, the organic ligands 52 coating the particles 50 are insufficient in number in the second end potion 47.

Assume that both the first end potion 46 and the second end potion 47 are a single-particle layer in relation to the particles 50. Here, the thickness of the first end potion 46 is greater than the thickness of the second end potion 47 in the thickness direction of the electron transport layer 44 because the ratio of the organic ligands 52 in the first end potion 46 is greater than the ratio of the organic ligands 52 in the second end potion 47.

Assume that the second end potion 47 is a single-particle layer in relation to the particles 50. Here, the thickness of the second end potion 47 is preferably from 1/30 times to ½ times, both inclusive, the thickness of the whole electron transport layer 44 in the thickness direction of the electron transport layer 44 because as described above, the electron transport layer 44 preferably has a thickness greater than or equal to a 2-particle layer and less than or equal to a 30-particle layer.

Multicolor Display

The display device 2 in accordance with present Embodiment 1 is preferably capable of a multicolor display such as a three-primary-color display. For instance, as shown in FIG. 3, the display device 2 includes: red subpixels Pr each including a light-emitting element ES that emits red light; green subpixels Pg each including a light-emitting element ES that emits green light; and blue subpixels Pb each including a light-emitting element ES that emits blue light.

Figure 4:
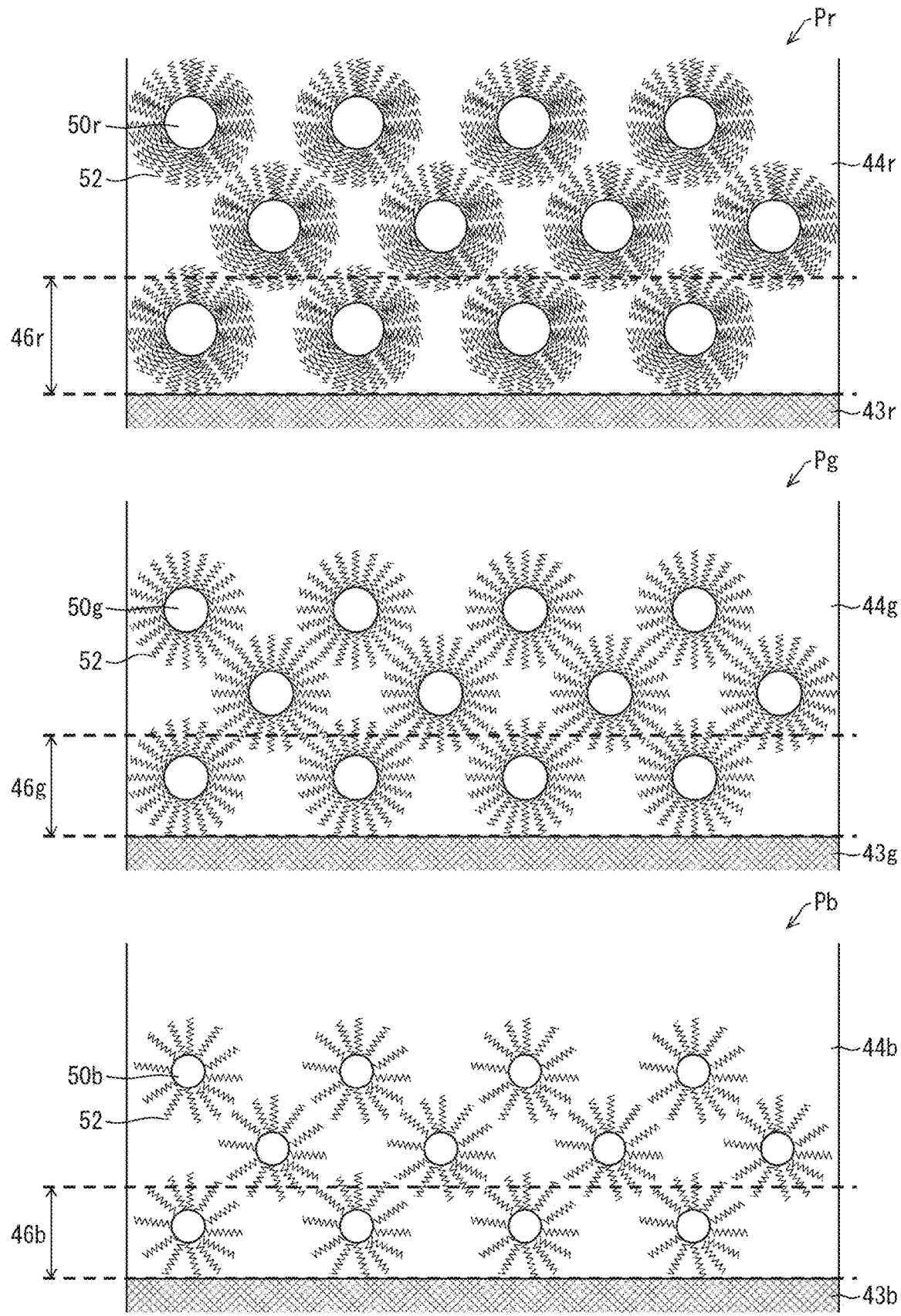
FIG. 4 is schematic cross-sectional views each of a first end potion of an electron transport layer, located close to a light-emitting layer, in a subpixel that emits light of a different color in accordance with the embodiment of the disclosure.

FIG. 4 is schematic cross-sectional views of a first end potion layer 46*r*, 46*g*, 46*b* of an electron transport layer 44*r*, 44*g*, 44*b*, located close to a light-emitting layer 43*r*, 43*g*, 43*b* in the subpixel Pr, Pg, Pb.

Referring to FIG. 4, the light-emitting element ES in the red subpixel Pr includes: the red light-emitting layer 43*r* (third photoelectric conversion layer) that emits red light; and the red electron transport layer 44*r* (third carrier transport layer) suited for the transport of electrons to the red light-emitting layer 43*r*. Similarly, the light-emitting element ES in the green subpixel Pg includes: the green light-emitting layer 43*g* (second photoelectric conversion layer) that emits green light; and the green electron transport layer 44*g* (second carrier transport layer) suited for the transport of electrons to the green light-emitting layer 43*g*. Similarly, the light-emitting element ES in the blue subpixel Pb includes: the blue light-emitting layer 43*b* (first photoelectric conversion layer) that emits blue light; and the blue electron transport layer 44*b* (first carrier transport layer) suited for the transport of electrons to the blue light-emitting layer 43*b*.

The blue light-emitting layer 43*b* has a lower electron affinity relative to the vacuum energy level than does the green light-emitting layer 43*g*. The green light-emitting layer 43*g* has a lower electron affinity relative to the vacuum energy level than does the red light-emitting layer 43*r*. The electron affinity of each light-emitting layer 43*r*, 43*g*, 43*b* is the electron affinity of quantum dots (especially, the cores of quantum-dot nanocrystals) in that light-emitting layer 43*r*, 43*g*, 43*b*.

Therefore, if a single electron transport layer is used as the electron transport layers 44*r*, 44*g*, 44*b*, it is more difficult to inject electrons to the blue light-emitting layer 43*b* than to the green light-emitting layer 43*g*, and it is more difficult to inject electrons to the green light-emitting layer 43*g* than to the red light-emitting layer 43*r*. Therefore, the electron transport layers 44*r*, 44*g*, 44*b* are preferably provided individually to strike a good balance in carrier injection to the light-emitting elements ES.

Specifically, the ratio of the organic ligands 52 in the first end potion 46*b* of the blue electron transport layer 44*b* is preferably lower than the ratio of the organic ligands 52 in the first end potion 46*g* of the green electron transport layer 44*g*. Alternatively or additionally, particles 50*b* in the blue electron transport layer 44b preferably have a smaller particle diameter than do particles 50g in the green electron transport layer 44g.

Similarly, the ratio of the organic ligands 52 in the first end potion 46g of the green electron transport layer 44g is preferably lower than the ratio of the organic ligands 52 in the first end potion 46r of the red electron transport layer 44r. Alternatively or additionally, the particles 50g in the green electron transport layer 44g preferably have a smaller particle diameter than do particles 50r in the red electron transport layer 44r.

Note that this is by no means the only possible implementation of the disclosure. The disclosure encompasses display devices capable of a multicolor display by using color filters.

Method of Manufacturing Light-Emitting Element Layer

The following will describe a method of forming the light-emitting element layer 5 shown in FIG. 3 in detail with reference to FIGS. 5 to 9.

Figure 5:
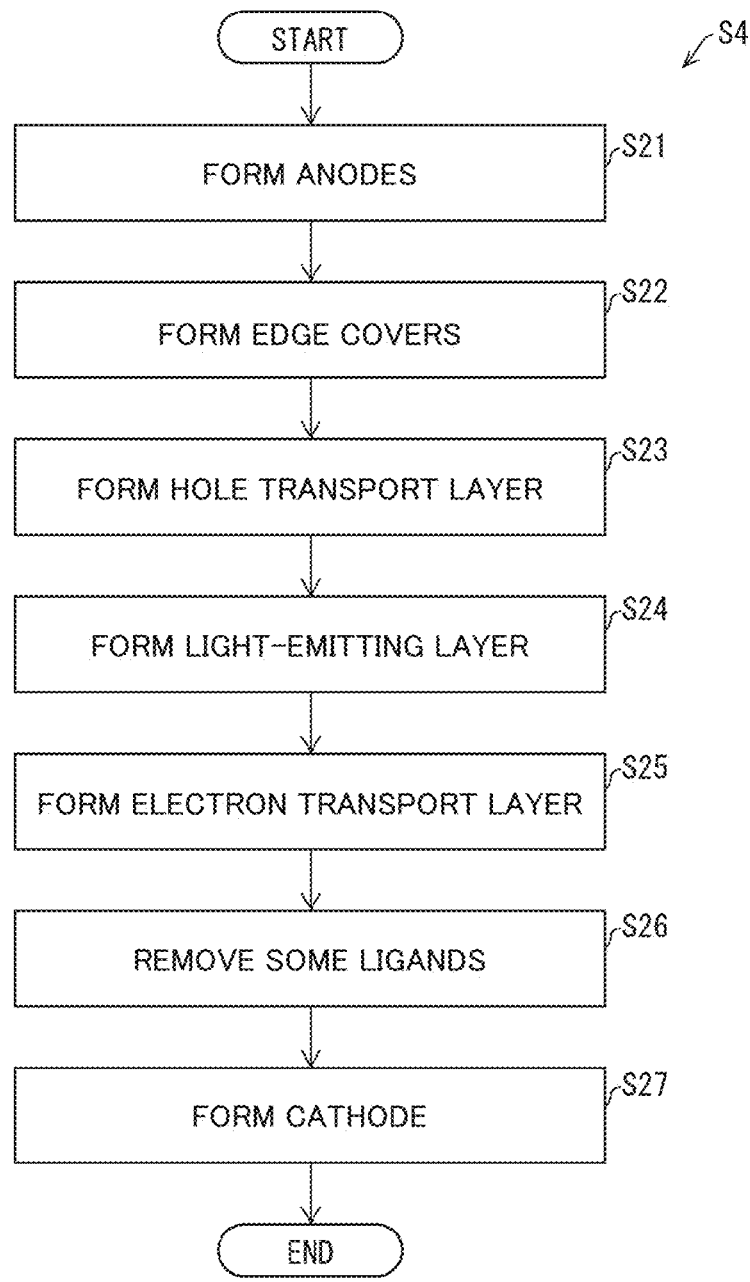
FIG. 5 is a schematic flow chart representing steps of forming a light-emitting element layer shown in FIG. 3.
Figure 6:
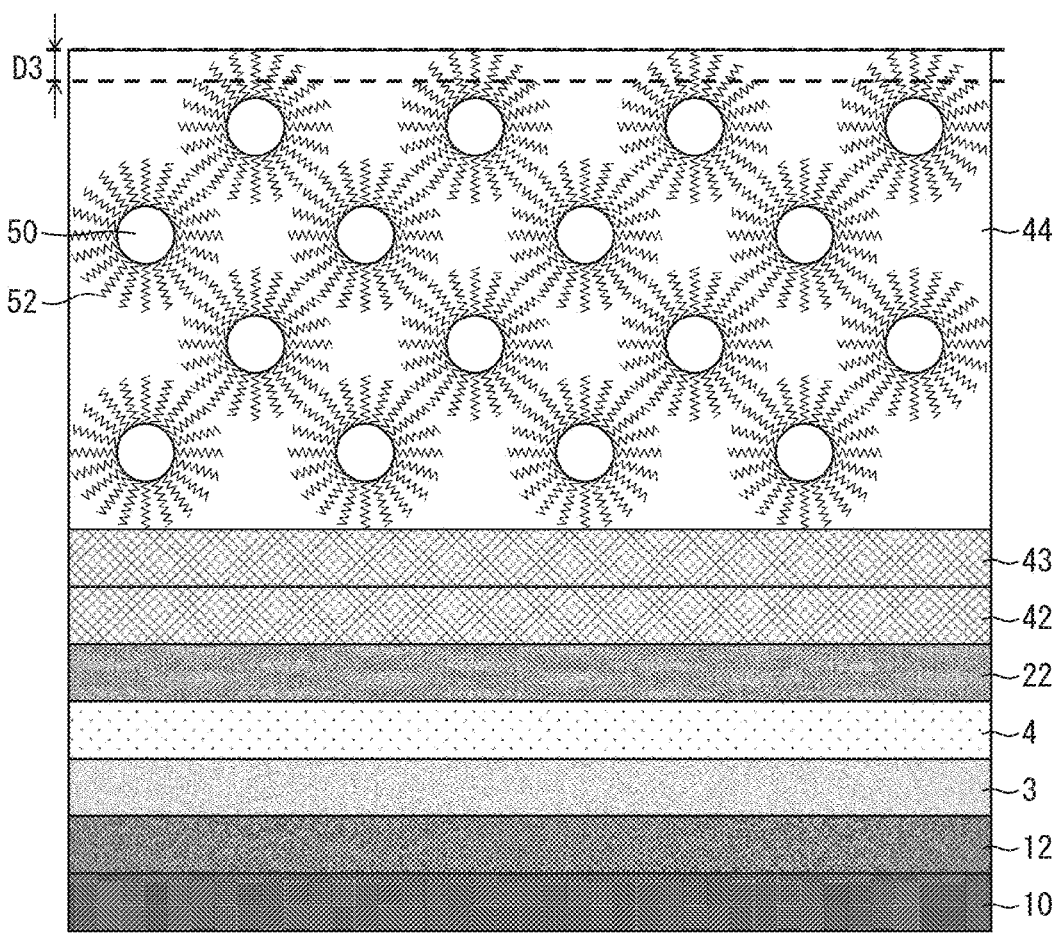
FIG. 6 is a schematic cross-sectional view illustrating one of the steps of forming a light-emitting element layer shown in FIG. 3.
Figure 7:
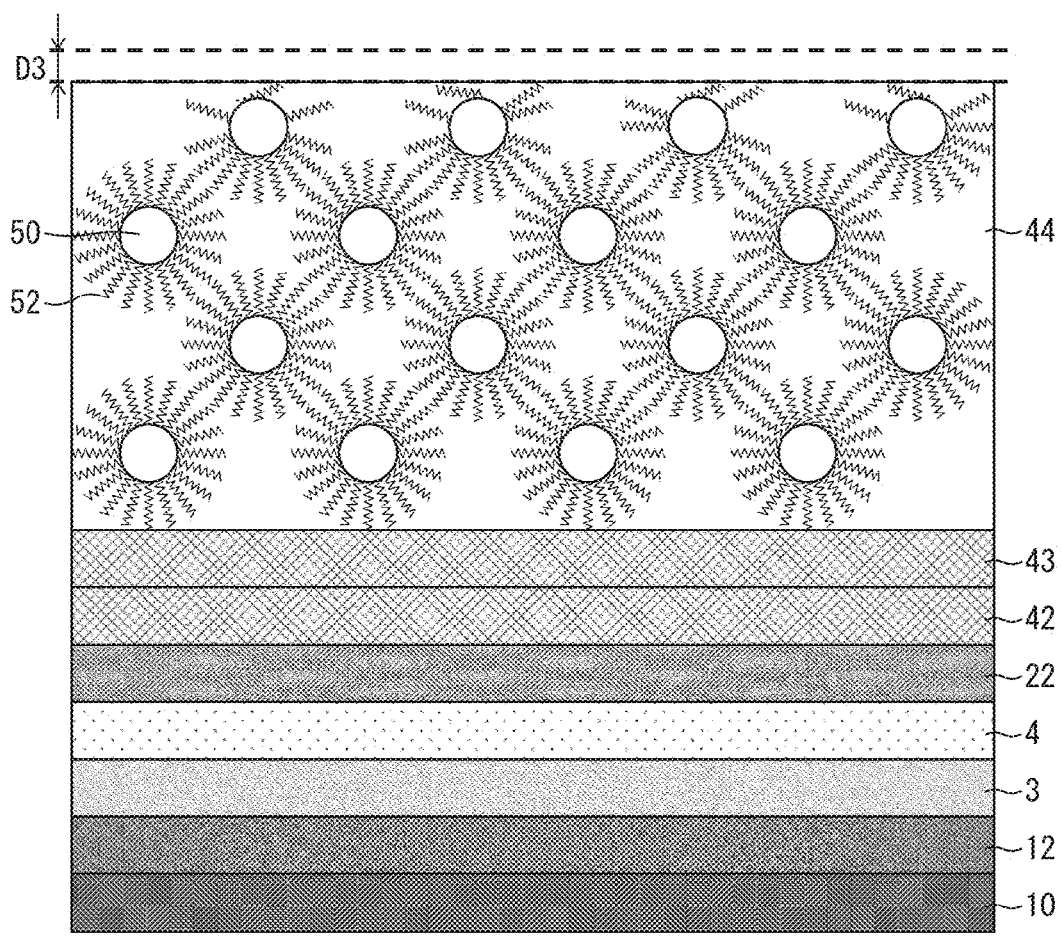
FIG. 7 is another schematic cross-sectional view illustrating one of the steps of forming a light-emitting element layer shown in FIG. 3.
Figure 8:
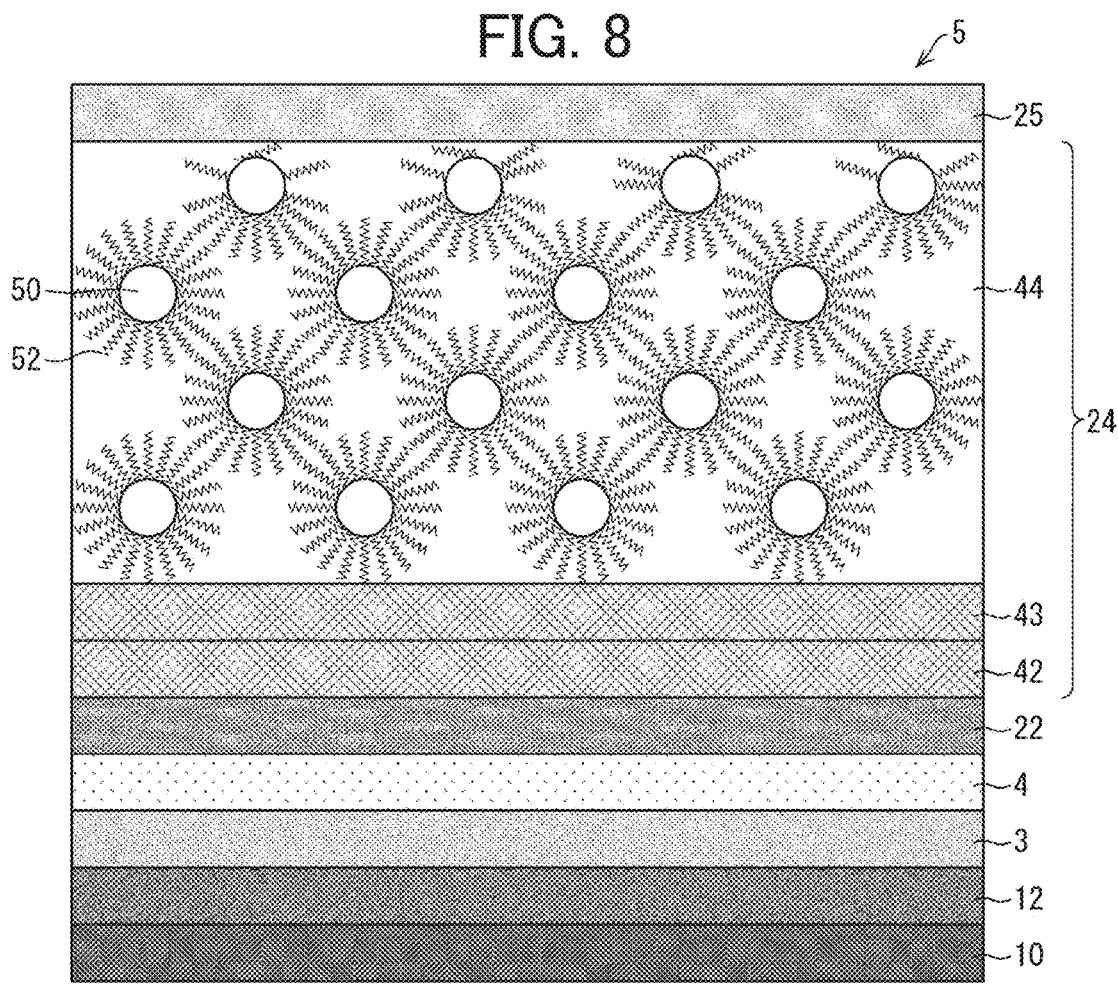
FIG. 8 is another schematic cross-sectional view illustrating one of the steps of forming a light-emitting element layer shown in FIG. 3.
Figure 9:
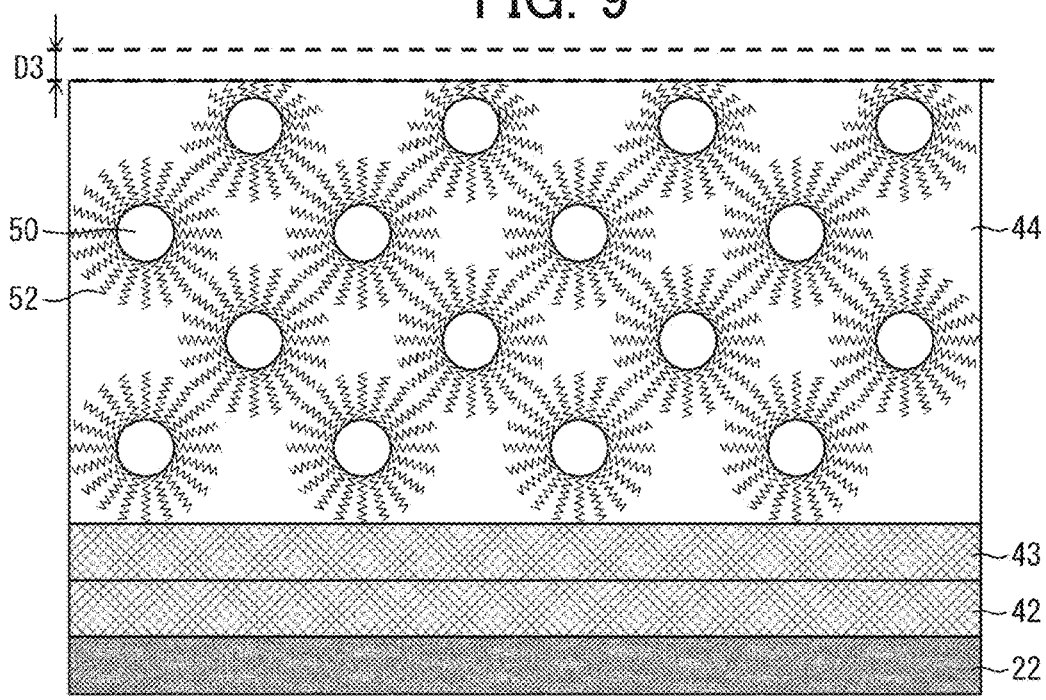
FIG. 9 is a schematic cross-sectional view illustrating another example of the step illustrated in FIG. 7.

FIG. 5 is a schematic flow chart representing steps (step S4 in FIG. 1) of forming the light-emitting element layer 5. FIGS. 6 to 8 are schematic cross-sectional views of some of the steps of forming the light-emitting element layer 5. FIG. 9 is a schematic cross-sectional view illustrating another example of the step illustrated in FIG. 7.

As shown in FIGS. 5 and 6, first, the insular anodes 22 are formed overlying the thin film transistor layer 4 (first step, step S21), and as shown in FIG. 5, the edge covers 23 (see FIG. 2) are formed covering the edges of the anodes 22 (step S22). Next, as shown in FIGS. 5 and 6, the hole transport layer 42 is formed overlying the anodes 22 and the edge covers 23 (step S23).

Subsequently, as shown in FIGS. 5 and 6, the light-emitting layer 43 is formed overlying the anodes 22 (second step, step S24). In other words, the light-emitting layer 43 is formed overlying the hole transport layer 42. Next, as shown in FIGS. 5 and 6, the electron transport layer 44 is formed overlying the light-emitting layer 43 (third step, step S25). The electron transport layer 44, as described above, contains the plurality of particles 50 (carrier transport particles) and the plurality of organic ligands 52 capable of being coordinated to the particles 50.

Subsequently, as shown in FIGS. 5 and 7, the plurality of organic ligands 52 are partially removed from the electron transport layer 44 (fifth step, step S26). Here, the organic ligands 52 are removed only up to a thickness D3. In contrast, the particles 50 are not removed, so that all of the particles 50 can remain.

In step S26, one or more methods selected from the group consisting of ashing, etching, ultraviolet radiation, ozone exposure, and organic washing in an organic solvent is/are used on the upper end potion of the electron transport layer 44. Examples of the organic solvent include alcohols such as methanol, ethanol, and butanol; ethers such as dimethyl ether; ketones such as acetone; and carboxylic acids such as formic acid.

In step S26, one or more methods selected from the group consisting of ashing and etching is/are preferably used if the following two conditions are met.

The particles 50 either contain one or more metal oxides selected from the group consisting of ZnO, MgO, and LiO or contain a mixed crystal containing one or more metal oxides selected from the group.

The organic ligands 52 contain a compound with one or more substituent species selected from the group consisting of an alcohol group, a keto group, a carbonyl group, a phenyl group, an ether group, an ester group, an amino group, and a thiol group.

For instance, the organic ligands 52 contain one or more organic compound selected from the group consisting of PVP, octadecene, oleic acid, oleyl amine, triethylamine, ethanol amine, and triethanol amine.

This is because if these two conditions are met, the particles 50 can be exposed on the top face of the electron transport layer 44 by using only either one of ashing and etching.

The thickness D3 up to which the organic ligands 52 are removed in step S26 is preferably from 1 nm to 20 nm, both inclusive, in the thickness direction of the electron transport layer 44 because, as described above, the second end potion 47 is preferably a single-particle layer in relation to the particles 50, the particles 50 preferably have a particle diameter of from 1 nm to 10 nm, both inclusive, and the organic ligands 52 preferably have a molecular length of from 1 nm to 10 nm, both inclusive. If the thickness D3 is less than 1 nm, the thickness D3 is smaller than the molecular length of the organic ligands 52. The particles 50 cannot therefore be exposed. The thickness D3 is hence preferably greater than or equal to 1 nm. If the thickness D3 exceeds 20 nm, the thickness D3 is greater than the sum of particle diameter of the particles 50 and the molecular length of the organic ligands 52. The organic ligands 52 between the particles 50 in the topmost part of the electron transport layer 44 and the particles 50 in the second top part of the electron transport layer 44 can therefore be removed. This renders the particles 50 more susceptible to being deactivated. Therefore, the thickness D3 is preferably less than or equal to nm.

FIG. 7 represents an example of removing, from the electron transport layer 44, the whole organic ligands 52 to be removed. The disclosure is however not limited to this example. Alternatively, parts of the organic ligands 52 to be removed may be removed from the electron transport layer 44 as shown in FIG. 9. In the case shown in FIG. 9, the organic ligands 52 in the first end potion 46 have a greater average molecular length than do the organic ligands 52 in the second end potion 47.

Finally, as shown in FIGS. 5 and 8, the cathode 25 is formed overlying the electron transport layer 44 (fourth step, step S27).

Comparative Example

Figure 10:
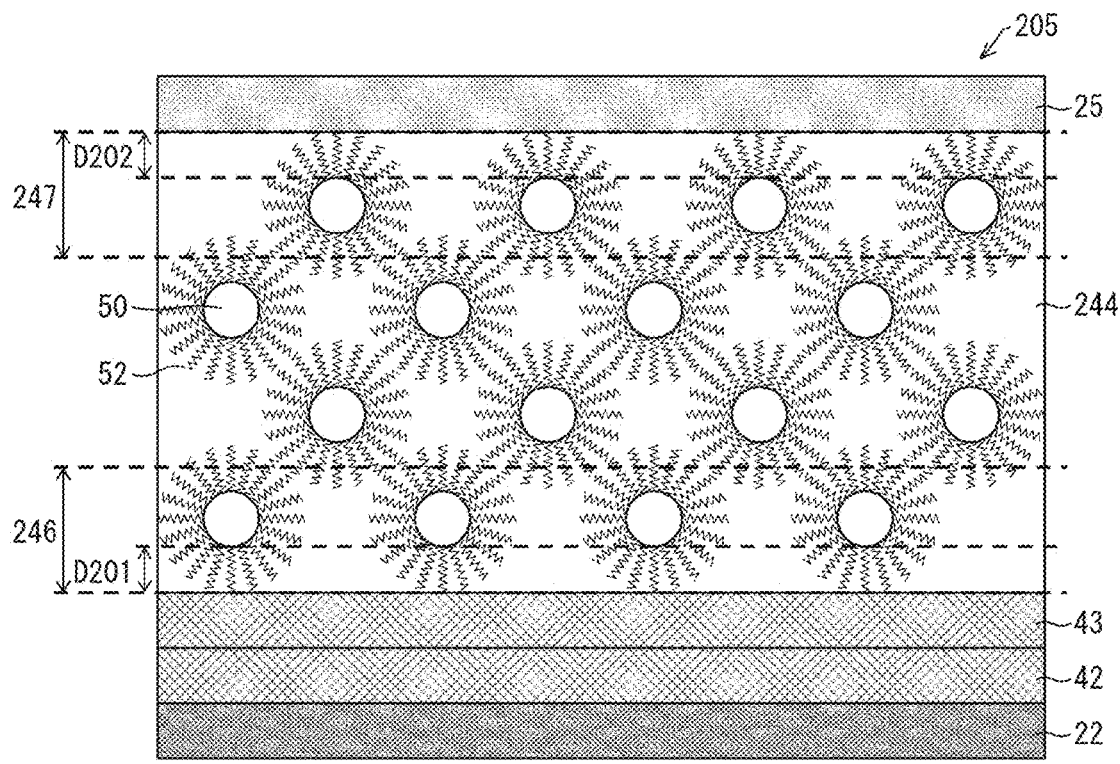
FIG. 10 is a schematic cross-sectional view of a structure of a light-emitting element layer 205 in accordance with a comparative example.

FIG. 10 is a schematic cross-sectional view of a structure of a light-emitting element layer 205 in accordance with a comparative example.

Such a light-emitting element layer 205 is obtained by, subsequent to steps S21 to S25, performing step S27 without performing step S26.

A comparison of FIGS. 3 and 10 shows that the minimum distance D1 (see FIG. 3) between the particles 50 in the first end potion 46 and the light-emitting layer 43 in accordance with present Embodiment 1 is substantially equivalent to a minimum distance D201 (see FIG. 10) between the particles 50 in a first end potion 246 and the light-emitting layer 43 in accordance with the comparative example. In contrast, the minimum distance D2 (see FIG. 3) between the particles 50 in the second end potion 47 and the cathode 25 in accordance with present Embodiment 1 is smaller than a minimum distance D202 (see FIG. 10) between the particles 50 in a second end potion 247 and the cathode 25 in accordance with the comparative example.

Therefore, the electrical contacts between the particles 50 in the electron transport layer 44 and the cathode 25 are better in the structure in accordance with present Embodiment 1 than in the structure in accordance with the comparative example. In other words, either no electrostatic capacity is formed between the particles 50 and the cathode 25 or a smaller electrostatic capacity is formed between the particles 50 and the cathode 25 than in the comparative example.

Example

After steps S21 to S24, the electron transport layer 44 containing ZnO nanocrystals as the particles 50 and containing PVP as the organic ligands 52 was formed in step S25. The ZnO nanocrystals had a band cap of 3.3 eV, and the particle diameters thereof as measured by dynamic light scattering had a median of 3.7 nm. In addition, the nanoparticles containing ZnO nanocrystals and PVP modifying the ZnO nanocrystals had particle diameters with a median of 12 nm, as measured by dynamic light scattering.

Therefore, the thickness of the organic ligands 52 to be removed was calculated as being equal to (12−3.7)/2=4.15 nm.

Subsequently, in step S26, the organic ligands 52 were removed only up to a thickness of 4.15 nm from the surface of the electron transport layer 44 by oxygen plasma ashing. The ashing was performed (ashing conditions) under a pressure of 20 Pa with an output of 150 W and oxygen project for 5 seconds while adjusting the temperature of the sample stage to normal temperature (20 degrees Celsius).

Furthermore, step S27 was performed to obtain the light-emitting element layer 5 with the structure shown in FIG. 3.

Embodiment 2

Figure 11:
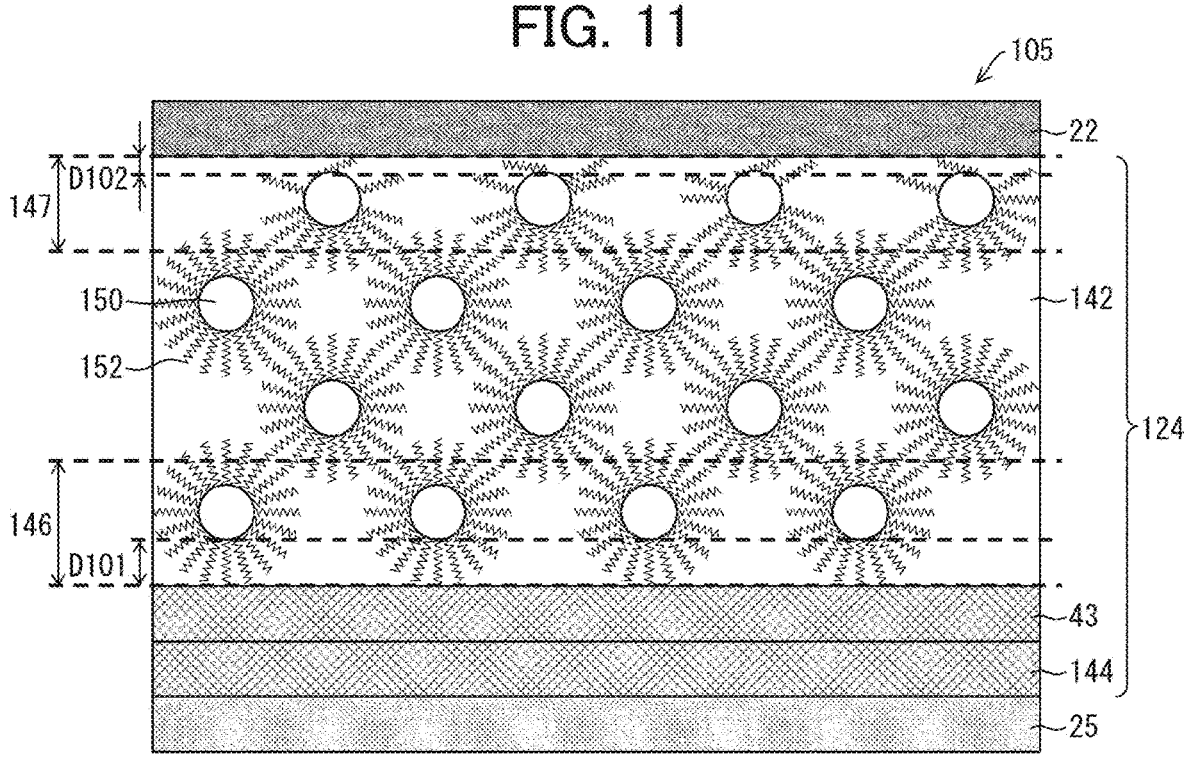
FIG. 11 is a schematic cross-sectional view of a structure of a light-emitting element layer in accordance with another embodiment of the disclosure.
Figure 12:
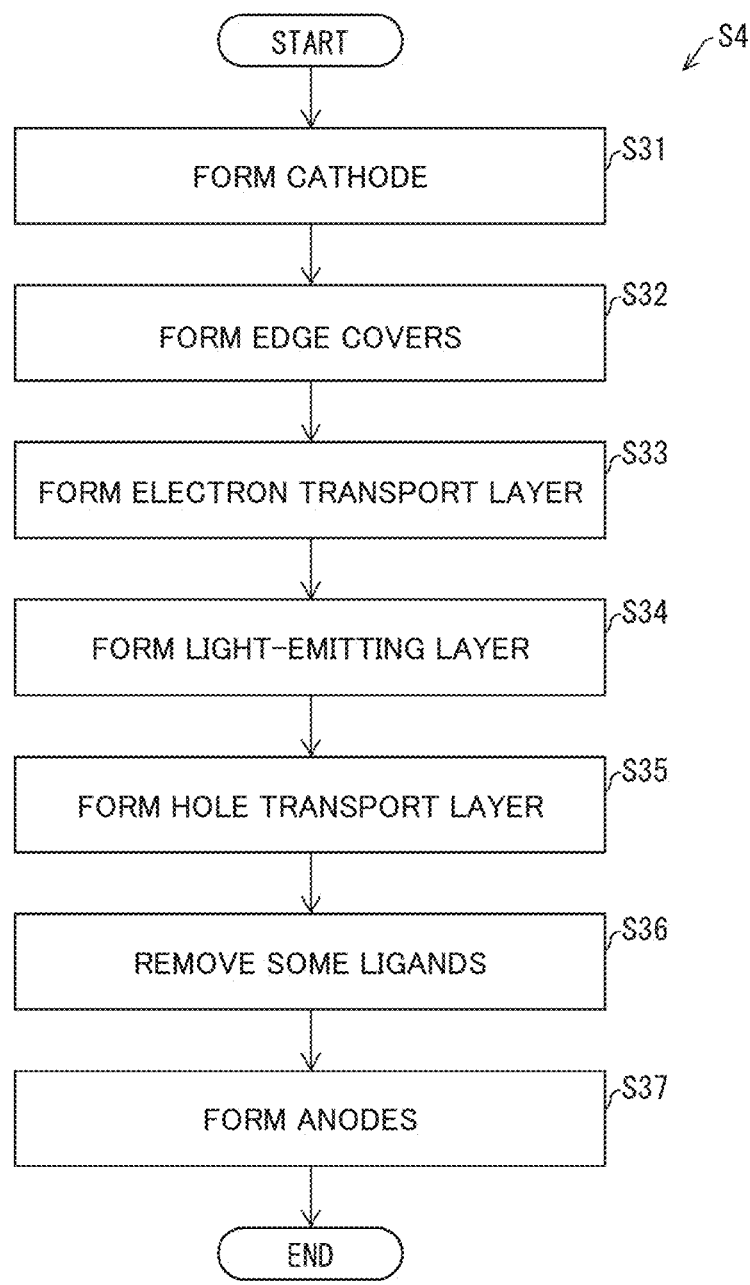
FIG. 12 is a schematic flow chart representing steps of forming a light-emitting element layer shown in FIG. 11.

A description is now given of another embodiment of the disclosure with reference to FIGS. 11 to 12.

Members of the present embodiment that are identical or similar to those described in aforementioned Embodiment 1 are indicated by identical or similar reference numerals, and description thereof is omitted.

Referring to FIG. 11, a light-emitting element layer 105 in accordance with present Embodiment 2 includes: cathodes 25 (first electrodes) and an anode 22 (second electrode) facing each other; a light-emitting layer 43 (photoelectric conversion layer) between the cathodes 25 and the anode 22; an electron transport layer 144 between the light-emitting layer 43 and the cathodes 25; and a hole transport layer 142 (carrier transport layer) between the light-emitting layer 43 and the anode 22.

As described here, the light-emitting element layer 105 in accordance with present Embodiment 2 has a reverse vertical stack sequence when compared with the light-emitting element layer 5 in accordance with aforementioned Embodiment 1.

Electron Transport Layer

The electron transport layer 144 may have any structure. The electron transport layer 144 may contain one or more electron-transporting inorganic materials, may contain one or more electron-transporting organic materials, and may contain both one or more electron-transporting inorganic materials and one or more electron-transporting organic materials. The electron-transporting inorganic material is, for example, either one or more metal oxides selected from the group consisting of ZnO, MgO, LiO, TiO$_2$, ZrO$_2$, SnO$_2$, and Nb$_2$O$_3$ or a mixed crystal containing one or more metal oxides selected from the group. The electron-transporting organic material is, for example, TPBi (2,2',2''-(1,3,5-phenylene)-tris(1-phenyl-1-H-benzimidazole)).

The electrical contacts between the electron transport layer 144 and the cathodes 25 are preferably good. Alternatively, an additional electron injection layer may be provided between the electron transport layer 144 and the cathodes 25.

Hole Transport Layer

The hole transport layer 142 contains a plurality of particles 150 (carrier transport particles) and a plurality of organic ligands 152. The particles 150 are made of a hole transporting material and nano-sized in diameter (in other words, from 1 nm inclusive to 1,000 nm exclusive).

The hole transport layer 142 preferably has a suitable thickness similarly to the electron transport layer 44 in accordance with aforementioned Embodiment 1. Specifically, the hole transport layer 142 preferably has a thickness greater than or equal to a 2-particle layer and smaller than or equal to a 30-particle layer in relation to the particles 150.

The particles 150 preferably either contain one or more mixtures selected from the group consisting of a hole-transporting elemental semiconductor, compound semiconductor, oxide semiconductor, metal oxide, chalcogenide, and perovskite or contain two or more mixed crystals selected from the group. Hence, the particles 150 are composed of an inorganic material, and the organic ligands 152 are composed of an organic material. Therefore, the organic ligands 152 can be partially removed readily in a removing step detailed later (see step S36 in FIG. 12) without damaging the particles 150.

The particles 150 more preferably either contain one or more metal oxides selected from the group consisting of NiO, MgO, LaO, MnO$_3$, V$_2$O$_5$, WO$_3$, and ReO$_3$ or contain a mixed crystal containing one or more metal oxides selected from the group. Examples of the mixed crystal include MgNiO and LaNiO$_3$ because mixed crystals allow for finer control of the conduction band energy level.

The particles 150 preferably have a particle diameter of from 1 nm to 10 nm, both inclusive, similarly to the particles 150 in accordance with aforementioned Embodiment 1.

The organic ligands 152 are an organic compound capable of being coordinated to the particles 150. The organic ligands 52 contain, for example, a compound with one or more substituent species selected from the group consisting of an alcohol group, a keto group, a carbonyl group, a phenyl group, an ether group, an ester group, an amino group, and a thiol group. The organic ligands 152 may contain, for example, one or more organic compounds selected from the group consisting of PVP (polyvinyl phenol), octadecene, oleic acid, oleyl amine, triethylamine, ethanol amine, and triethanol amine.

The organic ligands 152 preferably have a molecular length of from 1 nm to 10 nm, both inclusive, similarly to the organic ligands 52 in accordance with aforementioned Embodiment 1.

End Potion of Hole Transport Layer

The hole transport layer 142 has a first end potion 146 and a second end potion 147. The first end potion 146 is a part of the hole transport layer 142 that is located close to the light-emitting layer 43 in the thickness direction of the hole transport layer 142. The second end potion 147 is a part of the hole transport layer 142 that is located close to the anode 22 in the thickness direction of the hole transport layer 142. In the hole transport layer 142, the particles 150 in the first end potion 146 are separated from the light-emitting layer 43 by at least a minimum distance D101 (first minimum distance), the particles 150 in the second end potion 147 are separated from the anode 22 by at least a minimum distance D102 (second minimum distance), and the minimum distance D101 is larger than the minimum distance D102.

The aforementioned difference between the minimum distances is achieved by the organic ligands 152 being distributed differently in the first end potion 146 and the second end potion 147. Specifically, the ratio of the organic ligands 152 in the first end potion 146 to the particles 150 in the first end potion 146 (first ratio) is larger than the ratio of the organic ligands 152 in the second end potion 147 to the particles 150 in the second end potion 147 (second ratio).

Method of Manufacturing Light-Emitting Element Layer

The following will describe a method of forming the light-emitting element layer 105 shown in FIG. 11 in detail with reference to FIG. 12.

FIG. 12 is a schematic flow chart representing steps (step S4 in FIG. 1) of forming the light-emitting element layer 105.

Referring to FIG. 12, first, the insular cathodes 25 are formed overlying the thin film transistor layer 4 (first step, step S23), and the edge covers 23 (see FIG. 2) are formed covering the edges of the cathodes 25 (step S32). Next, the electron transport layer 144 is formed overlying the cathodes 25 and the edge covers 23 (step S33).

Subsequently, the light-emitting layer 43 is formed overlying the cathodes 25 (second step, step S34). In other words, the light-emitting layer 43 is formed overlying the electron transport layer 144. Next, the hole transport layer 142 is formed overlying the light-emitting layer 43 (third step, step S35). The hole transport layer 142, as described above, contains the plurality of particles 150 (carrier transport particles) and the plurality of organic ligands 152 capable of being coordinated to the particles 150.

Subsequently, the plurality of organic ligands 152 are partially removed from the hole transport layer 142 (fifth step, step S36), and the anode 22 is formed overlying the hole transport layer 142 (fourth step, step S37).

Summation

The disclosure, in aspect 1 thereof, is directed to a photoelectric conversion element including: a first electrode and a second electrode facing each other; a photoelectric conversion layer between the first electrode and the second electrode; and a carrier transport layer between the photoelectric conversion layer and the second electrode, the carrier transport layer containing a plurality of carrier transport particles and a plurality of organic ligands capable of being coordinated to each of the plurality of carrier transport particles, the carrier transport layer having a first end potion located close to the photoelectric conversion layer in a thickness direction of the carrier transport layer and a second end potion located close to the second electrode in the thickness direction of the carrier transport layer, wherein a first minimum distance between the plurality of carrier transport particles in the first end potion and the photoelectric conversion layer is larger than a second minimum distance between the plurality of carrier transport particles in the second end potion and the second electrode.

The disclosure, in aspect 2 thereof, is directed to a photoelectric conversion element including: a first electrode and a second electrode facing each other; a photoelectric conversion layer between the first electrode and the second electrode; and a carrier transport layer between the photoelectric conversion layer and the second electrode, the carrier transport layer containing a plurality of carrier transport particles and a plurality of organic ligands capable of being coordinated to each of the plurality of carrier transport particles, the carrier transport layer having a first end potion located close to the photoelectric conversion layer in a thickness direction of the carrier transport layer and a second end potion located close to the second electrode in the thickness direction of the carrier transport layer, wherein a first ratio of the plurality of organic ligands in the first end potion to the plurality of carrier transport particles in the first end potion is larger than a second ratio of the plurality of organic ligands in the second end potion to the plurality of carrier transport particles in the second end potion.

The photoelectric conversion element of aspect 3 of the disclosure has the structure described in aspect 2 above and may be configured such that the second ratio is from 0 to ½ times, both inclusive, the first ratio.

The photoelectric conversion element of aspect 4 of the disclosure has the structure described in aspect 2 above and may be configured such that the second electrode is a cathode and has the structure described in any one of aspects 1 to 3 above, the carrier transport layer is an electron transport layer, and the plurality of carrier transport particles either contain one or more mixtures selected from the group consisting of an electron-transporting elemental semiconductor, compound semiconductor, oxide semiconductor, metal oxide, chalcogenide, and perovskite or contain two or more mixed crystals selected from the group.

The photoelectric conversion element of aspect 5 of the disclosure has the structure described in aspect 4 above and may be configured such that the plurality of carrier transport particles either contain one or more metal oxides selected from the group consisting of ZnO, MgO, LiO, $TiO_2$, $ZrO_2$, $SnO_2$, and $Nb_2O_3$ or contain a mixed crystal containing one or more metal oxides selected from the group.

The photoelectric conversion element of aspect 6 of the disclosure has the structure described in aspect 4 above and may be configured such that the plurality of carrier transport particles contain a mixed crystal containing ZnO or ZnO, and the plurality of organic ligands contain an organic compound with one or more substituent species selected from the group consisting of an alcohol group, a keto group, a carbonyl group, a phenyl group, an ether group, an ester group, an amino group, and a thiol group.

The photoelectric conversion element of aspect 7 of the disclosure has the structure described in any one of aspects 1 to 3 above and may be configured such that the second electrode is an anode, the carrier transport layer is a hole transport layer, and the plurality of carrier transport particles either contain one or more mixtures selected from the group consisting of a hole-transporting elemental semiconductor, compound semiconductor, oxide semiconductor, metal oxide, chalcogenide, and perovskite or contain two or more mixed crystals selected from the group.

The photoelectric conversion element of aspect 8 of the disclosure has the structure described in aspect 7 above and may be configured such that the plurality of carrier transport particles either contain one or more metal oxides selected from the group consisting of NiO, MgO, LaO, $MnO_3$, $V_2O_5$, $WO_3$, and $ReO_3$ or contain a mixed crystal containing one or more metal oxides selected from the group.

The photoelectric conversion element of aspect 9 of the disclosure has the structure described in aspect 7 above and may be configured such that the plurality of organic ligands contain one or more organic compounds selected from the group consisting of PVP, octadecene, oleic acid, oleyl amine, triethylamine, ethanol amine, and triethanol amine.

The photoelectric conversion element of aspect 10 of the disclosure has the structure described in any one of aspects 1 to 9 above and may be configured such that the second end potion of the carrier transport layer is in contact with the second electrode.

The photoelectric conversion element of aspect 11 of the disclosure has the structure described in aspect 10 above and may be configured such that those carrier transport particles that are in the second end potion, out of the plurality of carrier transport particles, are in contact with the second electrode.

The photoelectric conversion element of aspect 12 of the disclosure has the structure described in any one of aspects 1 to 11 above and may be configured such that the first end potion has a larger thickness than does the second end potion in the thickness direction of the carrier transport layer, the plurality of carrier transport particles are particles, and both the first end potion and the second end potion are a single-particle layer in relation to the plurality of carrier transport particles.

The photoelectric conversion element of aspect 13 of the disclosure has the structure described in any one of aspects 1 to 12 above and may be configured such that the plurality of carrier transport particles are a metal oxide with a particle diameter of from 1 nm to nm, both inclusive.

The photoelectric conversion element of aspect 14 of the disclosure has the structure described in any one of aspects 1 to 13 above and may be configured such that the second end potion has a thickness 1/30 to 1/2 times, both inclusive, a thickness of the carrier transport layer in the thickness direction of the carrier transport layer, the plurality of carrier transport particles are particles, and the second end potion is a single-particle layer in relation to the plurality of carrier transport particles.

The photoelectric conversion element of aspect 15 of the disclosure has the structure described in any one of aspects 1 to 14 above and may be configured such that the photoelectric conversion layer contains quantum dots.

The photoelectric conversion element of aspect 16 of the disclosure has the structure described in any one of aspects 1 to 15 above and may be configured such that the photoelectric conversion layer is a light-emitting layer.

The photoelectric conversion element of aspect 17 of the disclosure has the structure described in any one of aspects 1 to 15 above and may be configured such that the photoelectric conversion layer is a light-receiving layer.

The disclosure, in aspect 18 thereof, is directed to a display device including two or more of the photoelectric conversion element described in any one of aspects 1 to 16 above, the two or more photoelectric conversion elements including a first photoelectric conversion element and a second photoelectric conversion element, wherein the photoelectric conversion layer and the carrier transport layer in the first photoelectric conversion element are a first photoelectric conversion layer and a first carrier transport layer respectively, the photoelectric conversion layer and the carrier transport layer in the second photoelectric conversion element are a second photoelectric conversion layer and a second carrier transport layer respectively, the first photoelectric conversion layer has a lower electron affinity relative to a vacuum energy level than does the second photoelectric conversion layer, and the first ratio is lower in the first carrier transport layer than in the second carrier transport layer.

The disclosure, in aspect 19 thereof, is directed to a display device including two or more of the photoelectric conversion element described in any one of aspects 1 to 16 above, the two or more photoelectric conversion elements including a first photoelectric conversion element and a second photoelectric conversion element, wherein the photoelectric conversion layer and the carrier transport layer in the first photoelectric conversion element are a first photoelectric conversion layer and a first carrier transport layer respectively, the photoelectric conversion layer and the carrier transport layer in the second photoelectric conversion element are a second photoelectric conversion layer and a second carrier transport layer respectively, the first photoelectric conversion layer has a lower electron affinity relative to a vacuum energy level than does the second photoelectric conversion layer, and the plurality of carrier transport particles in the first carrier transport layer have a smaller particle diameter than do the plurality of carrier transport partiicles in the second carrier transport layer.

The disclosure, in aspect 20 thereof, is directed to a method of manufacturing a photoelectric conversion element, the method including: a first step of forming a first electrode; a second step of forming a photoelectric conversion layer overlying the first electrode; a third step of forming a carrier transport layer overlying the photoelectric conversion layer so that the carrier transport layer contains a plurality of carrier transport particles and a plurality of organic ligands capable of being coordinated to each of the plurality of carrier transport particles; and a fourth step of forming a second electrode overlying the carrier transport layer, wherein the method further includes a fifth step of removing parts of the plurality of organic ligands from the carrier transport layer.

The method of manufacturing a photoelectric conversion element of aspect 21 of the disclosure is the method described in aspect 20 above and may be configured such that the fifth step is performed between the third step and the fourth step.

The method of manufacturing a photoelectric conversion element of aspect 22 of the disclosure is the method described in aspect 20 or 21 above and may be configured such that all of the plurality of carrier transport particles remain in the fifth step.

The method of manufacturing a photoelectric conversion element of aspect 23 of the disclosure is the method described in any one of aspects 20 to 22 above and may be configured such that the parts of the plurality of organic ligands are removed in the fifth step by one or more methods selected from the group consisting of ashing, etching, ultraviolet radiation, ozone exposure, and organic washing in an organic solvent.

The method of manufacturing a photoelectric conversion element of aspect 24 of the disclosure is the method described in aspect 23 above and may be configured such that the plurality of carrier transport particles either contain one or more metal oxides selected from the group consisting of ZnO and ZnMgO or contain a mixed crystal containing two or more metal oxides selected from the group, the plurality of organic ligands contain one or more organic compounds selected from the group consisting of PVP, octadecene, oleic acid, oleyl amine, triethylamine, ethanol amine, and triethanol amine, and the parts of the plurality of organic ligands are removed in the fifth step by one or more methods selected from the group consisting of ashing and etching.

The method of manufacturing a photoelectric conversion element of aspect 25 of the disclosure is the method described in any one of aspects 20 to 24 above and may be configured such that the plurality of organic ligands are removed in the fifth step only up to from 1 nm to 20 nm, both inclusive, in a thickness direction of the carrier transport layer.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A photoelectric conversion element comprising:
a first electrode and a second electrode facing each other;
a photoelectric conversion layer between the first electrode and the second electrode; and
a carrier transport layer between the photoelectric conversion layer and the second electrode, the carrier transport layer containing a plurality of carrier transport particles and a plurality of organic ligands capable of being coordinated to each of the plurality of carrier transport particles, the carrier transport layer having a first end potion located close to the photoelectric conversion layer in a thickness direction of the carrier transport layer and a second end potion located close to the second electrode in the thickness direction of the carrier transport layer, wherein
a first minimum distance between the plurality of carrier transport particles in the first end potion and the photoelectric conversion layer is larger than a second minimum distance between the plurality of carrier transport particles in the second end potion and the second electrode.

2. The photoelectric conversion element according to claim 1,
wherein
the second electrode is a cathode,
the carrier transport layer is an electron transport layer, and
the plurality of carrier transport particles either contain one or more mixtures selected from the group consisting of an electron-transporting elemental semiconductor, compound semiconductor, oxide semiconductor, metal oxide, chalcogenide, and perovskite or contain two or more mixed crystals selected from the group.

3. The photoelectric conversion element according to claim 2, wherein the plurality of carrier transport particles either contain one or more metal oxides selected from the group consisting of ZnO, MgO, LiO, $TiO_2$, $ZrO_2$, $SnO_2$, and $Nb_2O_3$ or contain a mixed crystal containing one or more metal oxides selected from the group.

4. The photoelectric conversion element according to claim 2, wherein
the plurality of carrier transport particles contain a mixed crystal containing ZnO or ZnO, and
the plurality of organic ligands contain an organic compound with one or more substituent species selected from the group consisting of an alcohol group, a keto group, a carbonyl group, a phenyl group, an ether group, an ester group, an amino group, and a thiol group.

5. The photoelectric conversion element according to claim 1,
wherein
the second electrode is an anode,
the carrier transport layer is a hole transport layer, and
the plurality of carrier transport particles either contain one or more mixtures selected from the group consisting of a hole-transporting elemental semiconductor, compound semiconductor, oxide semiconductor, metal oxide, chalcogenide, and perovskite or contain two or more mixed crystals selected from the group.

6. The photoelectric conversion element according to claim 5, wherein the plurality of carrier transport particles either contain one or more metal oxides selected from the group consisting of NiO, MgO, LaO, $MnO_3$, $V_2O_5$, $WO_3$, and $ReO_3$ or contain a mixed crystal containing one or more metal oxides selected from the group.

7. The photoelectric conversion element according to claim 5, wherein the plurality of organic ligands contain one or more organic compounds selected from the group consisting of PVP, octadecene, oleic acid, oleyl amine, triethylamine, ethanol amine, and triethanol amine.

8. The photoelectric conversion element according to claim 1, wherein the second end potion of the carrier transport layer is in contact with the second electrode.

9. The photoelectric conversion element according to claim 8, wherein those carrier transport particles that are in the second end potion, out of the plurality of carrier transport particles, are in contact with the second electrode.

10. The photoelectric conversion element according to claim 1, wherein
the first end potion has a larger thickness than does the second end potion in the thickness direction of the carrier transport layer,
the plurality of carrier transport particles are particles, and
both the first end potion and the second end potion are a single-particle layer in relation to the plurality of carrier transport particles.

11. The photoelectric conversion element according to claim 1, wherein the plurality of carrier transport particles are a metal oxide with a particle diameter of from 1 nm to 10 nm, both inclusive.

12. The photoelectric conversion element according to claim 1, wherein
the second end potion has a thickness ⅟₃₀ to ½ times, both inclusive, a thickness of the carrier transport layer in the thickness direction of the carrier transport layer,
the plurality of carrier transport particles are particles, and
the second end potion is a single-particle layer in relation to the plurality of carrier transport particles.

13. A display device comprising two or more of the photoelectric conversion element described in claim 1, the two or more photoelectric conversion elements including a first photoelectric conversion element and a second photoelectric conversion element, wherein
the photoelectric conversion layer and the carrier transport layer in the first photoelectric conversion element are a first photoelectric conversion layer and a first carrier transport layer respectively,
the photoelectric conversion layer and the carrier transport layer in the second photoelectric conversion element are a second photoelectric conversion layer and a second carrier transport layer respectively,
the first photoelectric conversion layer has a lower electron affinity relative to a vacuum energy level than does the second photoelectric conversion layer, and
a first ratio is lower in the first carrier transport layer than in the second carrier transport layer.

14. A display device comprising two or more of the photoelectric conversion element described in claim 1, the two or more photoelectric conversion elements including a first photoelectric conversion element and a second photoelectric conversion element, wherein
the photoelectric conversion layer and the carrier transport layer in the first photoelectric conversion element are a first photoelectric conversion layer and a first carrier transport layer respectively, the photoelectric conversion layer and the carrier transport layer in the second photoelectric conversion element are a second photoelectric conversion layer and a second carrier transport layer respectively, the first photoelectric conversion layer has a lower electron affinity relative to a vacuum energy level than does the second photoelectric conversion layer, and the plurality of carrier transport particles in the first carrier transport layer have a smaller particle diameter than do the plurality of carrier transport particles in the second carrier transport layer.

15. A photoelectric conversion element comprising:
a first electrode and a second electrode facing each other;
a photoelectric conversion layer between the first electrode and the second electrode; and
a carrier transport layer between the photoelectric conversion layer and the second electrode, the carrier transport layer containing a plurality of carrier transport particles and a plurality of organic ligands capable of being coordinated to each of the plurality of carrier transport particles, the carrier transport layer having a first end potion located close to the photoelectric conversion layer in a thickness direction of the carrier transport layer and a second end potion located close to the second electrode in the thickness direction of the carrier transport layer, wherein
a first ratio of the plurality of organic ligands in the first end potion to the plurality of carrier transport particles in the first end potion is larger than a second ratio of the plurality of organic ligands in the second end potion to the plurality of carrier transport particles in the second end potion.

16. The photoelectric conversion element according to claim 15, wherein the second ratio is from 0 to ½ times, both inclusive, the first ratio.

17. A method of manufacturing a photoelectric conversion element, the method comprising:
a first step of forming a first electrode;
a second step of forming a photoelectric conversion layer overlying the first electrode;
a third step of forming a carrier transport layer overlying the photoelectric conversion layer so that the carrier transport layer contains a plurality of carrier transport particles and a plurality of organic ligands capable of being coordinated to each of the plurality of carrier transport particles; and
a fourth step of forming a second electrode overlying the carrier transport layer, wherein
the method further includes a fifth step of removing parts of the plurality of organic ligands from the carrier transport layer.

18. The method of manufacturing a photoelectric conversion element according to claim 17, wherein the fifth step is performed between the third step and the fourth step.

19. The method of manufacturing a photoelectric conversion element according to claim 17, wherein all of the plurality of carrier transport particles remain in the fifth step.

20. The method of manufacturing a photoelectric conversion element according to claim 17, wherein the parts of the plurality of organic ligands are removed in the fifth step by one or more methods selected from the group consisting of ashing, etching, ultraviolet radiation, ozone exposure, and organic washing in an organic solvent.

* * * * *